(12) United States Patent
Wu

(10) Patent No.: US 7,819,239 B2
(45) Date of Patent: Oct. 26, 2010

(54) FEEDER FOR AN AUTO MOUNTING DEVICE

(75) Inventor: Qi-Hong Wu, Renwu Township, Kaohsiung County (TW)

(73) Assignee: Schenson Co., Ltd., Kaohsiung County (TW)

( * ) Notice: Subject to any disclaimer, the term of this patent is extended or adjusted under 35 U.S.C. 154(b) by 134 days.

(21) Appl. No.: 12/333,294

(22) Filed: Dec. 11, 2008

(65) Prior Publication Data

US 2010/0147649 A1    Jun. 17, 2010

(51) Int. Cl.
*G07F 11/66* (2006.01)

(52) U.S. Cl. ............ 198/793; 198/867.11; 414/416.08; 156/584; 221/21; 221/71; 226/24; 226/37; 226/45; 226/120; 226/138

(58) Field of Classification Search ............... 198/476.1, 198/793, 867.11; 414/416.08, 416.09, 416.1; 156/584; 221/25, 71, 74; 226/120, 122, 226/138, 188, 37, 45
See application file for complete search history.

(56) References Cited

U.S. PATENT DOCUMENTS

| | | | | |
|---|---|---|---|---|
| 5,941,674 A | * | 8/1999 | Briehl | 414/416.08 |
| 5,976,306 A | * | 11/1999 | Davis et al. | 156/344 |
| 6,077,022 A | * | 6/2000 | Gfeller et al. | 414/416.01 |
| 6,082,954 A | * | 7/2000 | Foster | 414/416.05 |
| 6,196,783 B1 | * | 3/2001 | Foster | 414/416.01 |
| 6,318,437 B1 | * | 11/2001 | Yoo et al. | 156/584 |
| 7,073,696 B2 | * | 7/2006 | College | 226/139 |
| 7,448,130 B2 | * | 11/2008 | Choi et al. | 29/806 |
| 7,594,592 B2 | * | 9/2009 | Hwang et al. | 221/74 |

\* cited by examiner

*Primary Examiner*—Mark A Deuble
(74) *Attorney, Agent, or Firm*—Banger Shia

(57) ABSTRACT

An feeder for an auto mounting device includes a main frame, a blocking mean, an intake assembly, a transmission assembly, an input assembly and a sensor. By the sensor detecting the movement of the auto mounting device and transmitting a signal to activate the transmission assembly, the feeder could be in a normal operation without having an intimate contacting with the auto mounting device. Therefore, the feeder can favorably prevent from tremor and attrition while operating in response to the auto mounting device, conducing to a prompt and regular action of the auto mounting device.

4 Claims, 4 Drawing Sheets

FEEDER FOR AN AUTO MOUNTING DEVICE

BACKGROUND OF THE INVENTION

1. Field of the Invention

The present invention relates to a feeder, more particularly to a feeder for an auto mounting device.

2. Description of the Related Art

Referring to FIG. 1, a conventional auto mounting device 1 includes a workbench 11 respectively defining a linking part 12, a holder 13, and a feeder 2 thereon. Wherein, the linking part 12 adopted by a piston acts the reciprocation as usual. Further, the feeder 2 includes a main frame 21 installed on the workbench 11 relative to the linking part 12, a blocking mean 22, an input assembly 23, and a rolling wheel 24 respectively installed on the main frame 21, and a transmission assembly 25 driven by the linking part 12 for further operating the input assembly 23 and the rolling wheel 24. Wherein, the main frame 21 has an input entrance 211 and an output exit 212 connecting with the input entrance 211. Moreover, the blocking mean 22, located on the input entrance 211, has an opening 221, an indentation 221È and a peeling surface 222 defined on the circumference of the indentation 221È.

Further, the input assembly 23 has an input wheel 231 pivoted on the main frame 21 and a chip carrier 232 wound around the input wheel 231. Wherein, the chip carrier 232 has a tape 233, a plurality of notches 235 indented on the tape 233 for the receipt of electronic chips 234, and a membrane 236 stuck on the notches 235. Moreover, the tape 232 sequentially rounds the input entrance 211, travels through the blocking mean 22, and thence goes out of the output exit 212; the membrane 236 is obstructed by the peeling surface 222 and peeled off the tape 233 to expose the notches 235 to the opening 221, so that the holder 13 could grab the electronic chips 234 for mounting, and the membrane 236 would be furled by the rolling wheel 24.

Furthermore, the transmission assembly 25 has a spring 251 installed on the main frame 21, a set of lever means 252 engaged with the spring 251, and an engaging wheel 253 driven by the leverage of the levers 252 for urging the tape 232. Wherein, one side of the lever set 252 is relatively orientated with respect to the linking part 12. Therefore, while the lever set 252 is pushed by the linking part 12, the engaging wheel 253 and the rolling wheel 24 would be concurrently driven. Whereas the linking part 12 escapes from the lever set 252, the lever set 252 returns to its original position under the resilience of the spring 251. Such reciprocation executes the incessant operation of the device 1.

Further referring to FIG. 2 depicts the interactions between the device 1 and the conventional feeder 2. The feeder 2 is completely progressed by the reciprocation of the linking part 12 (for instance of boosting the part 12 as arrowed) that pushes the lever set 252 to render the engaging wheel 253 rotated for triggering the transportation of the chip carrier 232. During the route, the membrane 236 could be departed from the tape 233 while being subjected to the blocking of the peeling surface 222 of the indentation 221È and in turn convolved on the rolling wheel 24. The forward notches 235 hence are exposed in communicated with the opening 221 for the holder 13 to grab the electronic chips 234 within the notches 235 therethrough. Oppositely, when the linking part 12 places in an downward motion (not shown), the lever set 252 would stop driving those wheels 253, 24 and running the tapes 23. Such reciprocation executes the incessant operation of the device 1.

However, the feeder 2 has the following shortcomings:

1. As the progress of the feeder 2 mainly relies on the intimate contact of the linking part 12 with the lever set 252 to drive the transmission assembly 25, the contact area of the lever set 252 and the linking part 12 readily generates abrasions through the long-term reciprocation. As a result, the pushing of the linking part 12 is affected, which results in an inaccurate reaction of the lever set 252 and the unstable feeding of the feeder 2.

2. Moreover, the reciprocation of the feeder 2 performing the boosting of the linking part 12 to trigger the lever set 252 and the resilience of the spring 251 to recover the lever set 252 inevitably causes related vibrations upon the main frame 21 of the feeder 2. Thus, the holder 13 is likewise unable to accurately grab the electronic chips 234, which however incurs a failing feeding. Although the speed of the pushing by the linking part 12 can be decreased to improve the deficiencies attendant on the feeder 2(s vibration, the producing efficiency is accordingly restricted.

SUMMARY OF THE INVENTION

The object of the present invention is to provide a feeder for an auto mounting device, which can preferably avoid abrasions and vibrations as well as solve the problem of the producing loss incurring from replacing the damaged feeder, thereby being conducive to enhance the stable and swift feeding efficiency.

The present invention essentially comprises an auto mounting device that includes a workbench respectively defining a linking part and a holder thereon, and a feeder disposed relative to the linking part. Wherein, the feeder includes a main frame installed on the workbench relative to the linking part, a blocking mean and an input assembly discretely arranged on the frame; characterized in that an intake assembly is respectively installed on the main frame, a transmission assembly pivoted to the main frame serves to drive the input assembly and the intake assembly, and a sensor interconnects with the transmission assembly for detecting reciprocating movements of the linking part. Whereby, the auto mounting device needs not to contact the feeder while operation. The operation just needs the sensor to sense the movements of the auto mounting device and transmit a signal to drive the transmission assembly. Thus, the generation of the vibrations during the operating the feeder and the abrasions caused by rubbing the linking part against the feeder could be avoided, hence beneficially rendering a speedy and steady execution for follow-up operations of the auto mounting device.

The advantages of the present invention over the known prior arts will become more apparent to those of ordinary skilled in the art by reading the following descriptions with the relating drawings.

DETAILED DESCRIPTION OF THE PREFERRED EMBODIMENTS

Figure 1:
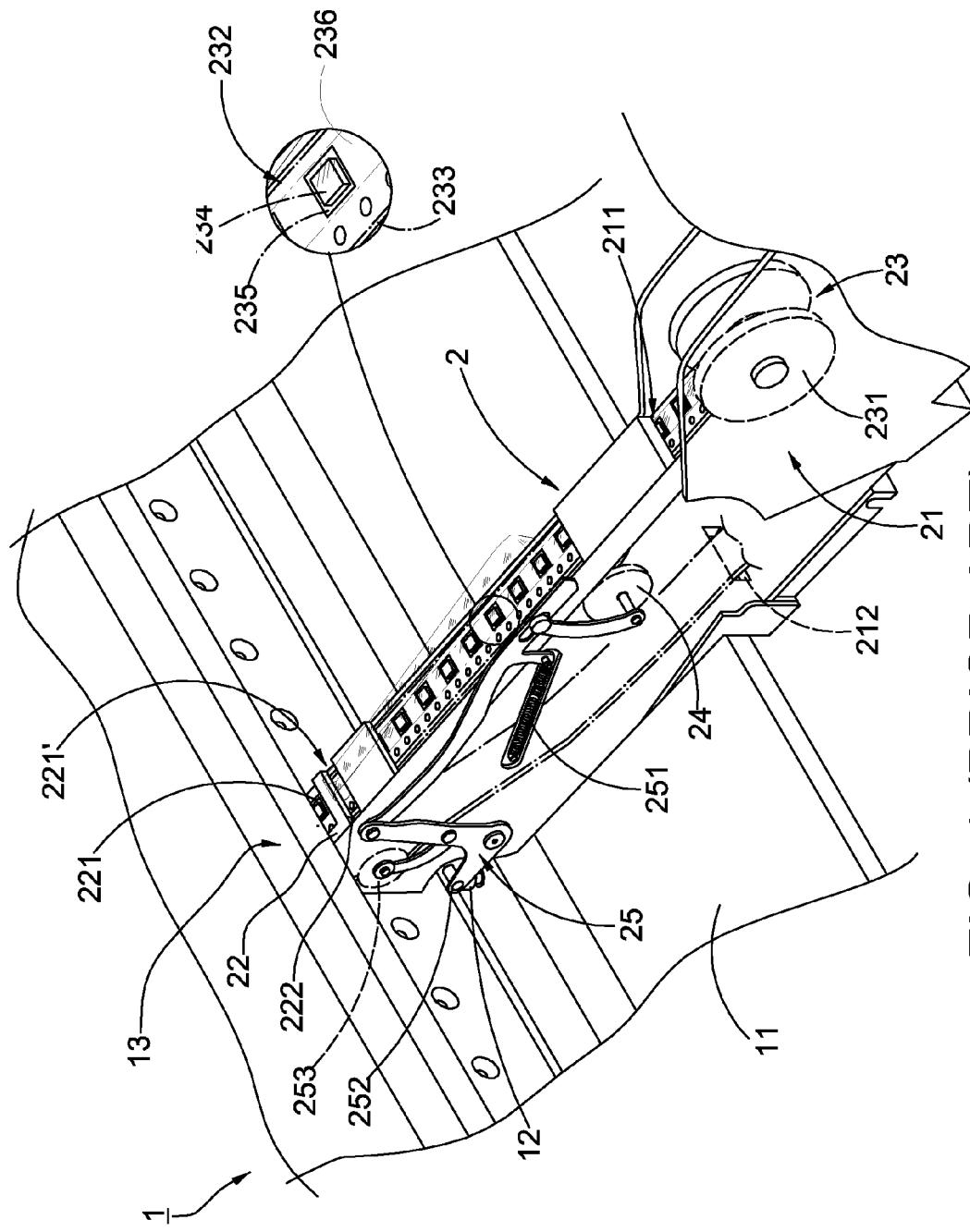
FIG. 1 is a perspective view showing a conventional invention.
Figure 2:
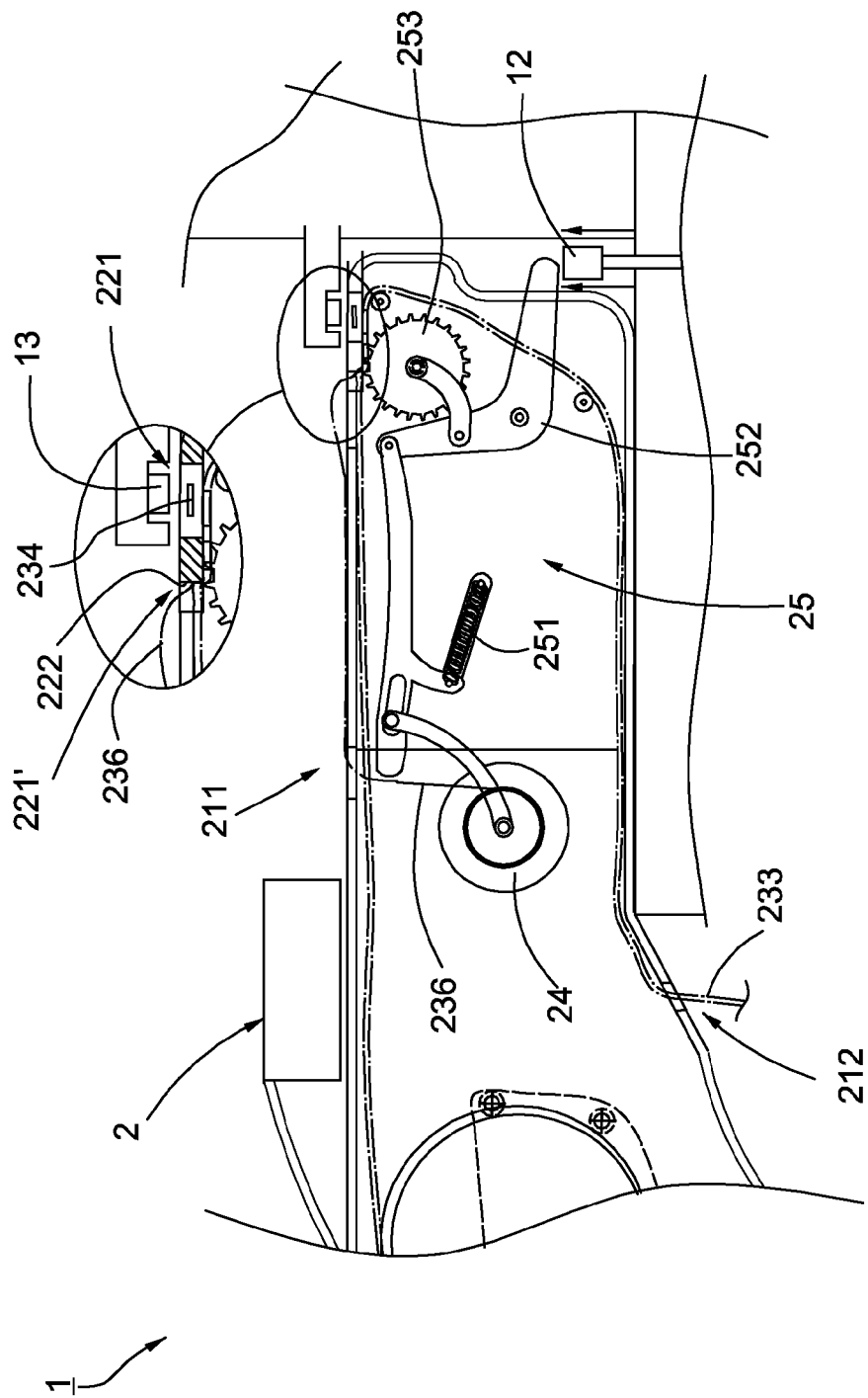
FIG. 2 is a schematic view showing the conventional invention.

Before describing in greater detail, it should note that the like elements are denoted by the similar reference numerals throughout the disclosure.

Figure 3:
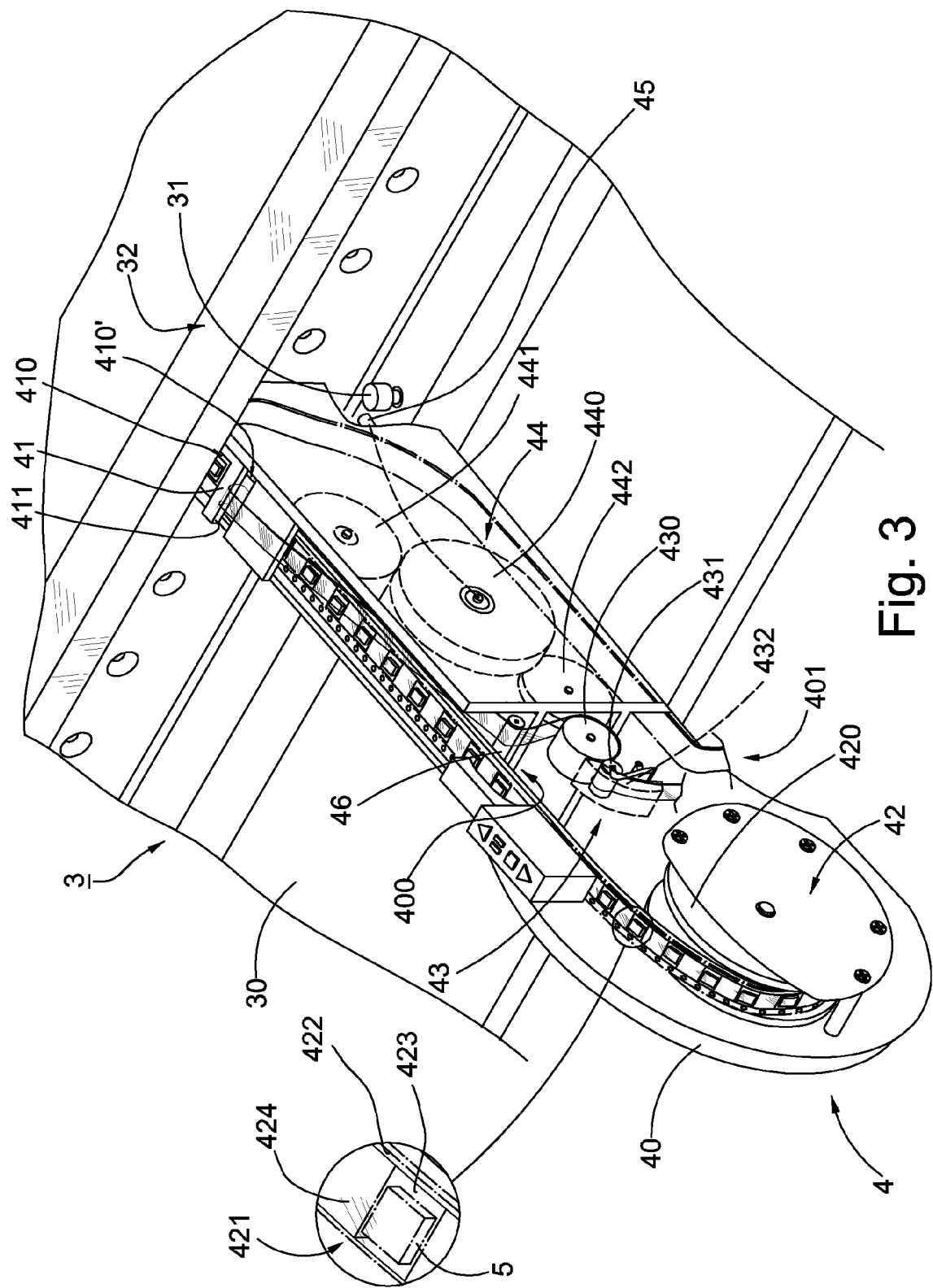
FIG. 3 is a perspective view showing a preferred embodiment of the present invention.
Figure 4:
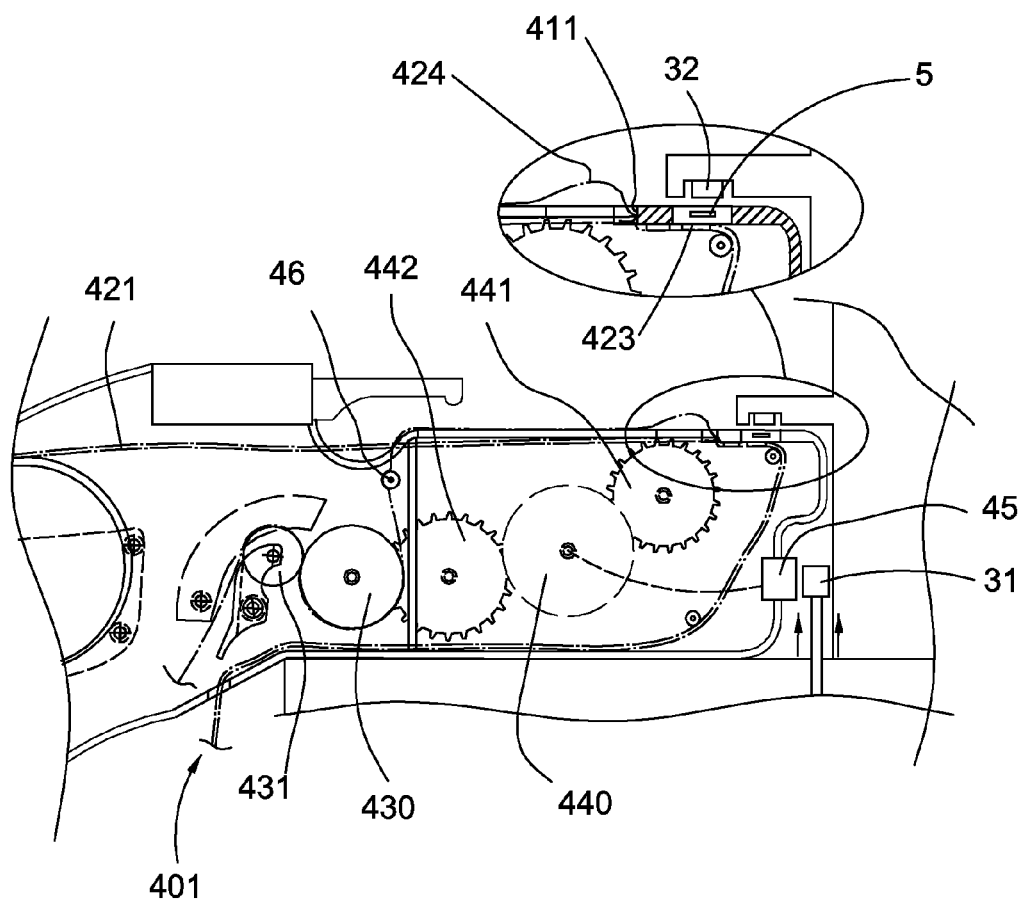
FIG. 4 is a schematic view showing the preferred embodiment of the present invention.

Referring to FIGS. 3 and 4, the present invention essentially comprises a mounting device 3 and a feeder 4 pivoted on the device 3. Wherein, the auto mounting device 3 includes a workbench 30 respectively defining a linking part 31 and a holder 32 thereon. Herein, the conformation of the workbench 30, linking part 31, and holder 32 is same as that of the convention and therefore omitted. Further, the feeder 4 includes a main frame 40, a blocking mean 41, an input assembly 42, an intake assembly 43, a transmission assembly 44, and a sensor 45. Wherein, the main frame 40 is installed on the workbench 30 correlative with the linking part 31 and provided with an input entrance 400 and an output exit 401; the blocking mean 41 is located on the input entrance 400 and comprised of formations of an indentation 410(, an opening 410 and a peeling surface 411; the input assembly 42 has an input wheel 420 convolved by a chip carrier 421 disposed on the main frame 40, in which a tape 422, electronic chips 5, notches 423, a membrane 424 are arranged. Herein, the concatenations of other interrelated elements among the main frame 40, the blocking mean 41, and the input assembly 42 are as the same as the conventional device 1, and herein are omitted.

Particularly, the transmission assembly 44 for respectively driving the input assembly 42 and the intake assembly 43 in the preferred embodiment of the present invention has a motor 440 installed on the main frame 40, an engaging wheel 441 triggered by the motor 440 for moving the chip carrier 421, and a driving wheel 442 driven by the motor 440 as well as driving the rolling of the intake assembly 43. In addition, the sensor 45 is installed on the main frame 40 for communicating with the motor 440 of the transmission assembly 44 and placed relative to the orientation of the linking part 31 at an interval, so as to transmit a signal to urge the motor 440 while sensing the motivation of the linking part 31 and further drives the transportation of the chip carrier 421 without vibrating the main frame 40.

Continuing with the aforementioned, the intake assembly 43 is respectively installed inside the main frame 40 and comprised of a succeeding wheel 430 geared to the driving wheel 442 for furling the membrane 424 and a restricting wheel 431 snugly leaning against the succeeding wheel 430. In this manner, the reciprocal cooperation between the succeeding wheel 430 and the driving wheel 442 renders the unstuck membrane 424 traveling across the succeeding wheel 430, going round the restricting wheel 431, and thence outputting from the output exit 401 for a direct collection while feeding the chip carrier 421. Further, a plurality of guiding wheels 46 can be alternatively pivoted on the main frame 40 to provide guidance to the membrane 424 and the chip carrier 421. In addition, a cover 432 can be appropriately installed on a periphery of the restricting wheel 431 to restrain an output path of the membrane 424.

Figure 5:
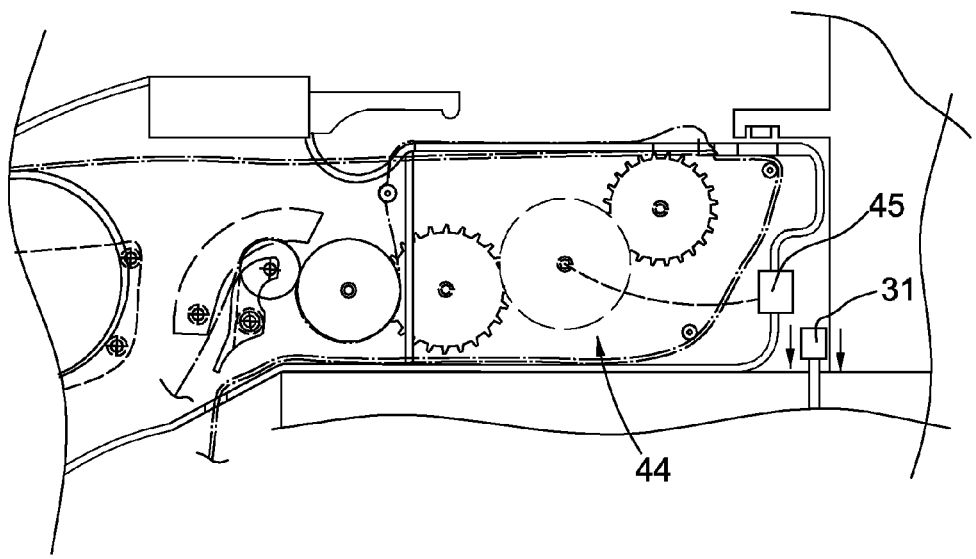
FIG. 5 is a schematic view showing the embodiment while operating.

Referring to FIGS. 3, 4 and 5 show the manipulation of the present invention, when an upward movement of the linking part 31 is detected by the sensor 45 (as arrowed in FIG. 4), the sensor 45 would transmit a signal to the motor 440 to drive the engaging wheel 441 for beginning the feeding of the chip carrier 421. Whereby, while the chip carrier 421 incessantly passes through the peeling surface 411, the membrane 424 would be peeled from the notches 423, so that the holder 32 could grab the electronic chips 5 within the notches 423 through the opening 410. The stripped membrane 424 would be rolled through those wheels 442, 430, 431 for a convenient collection without winding into a spool, and the driving wheel 442 would also facilitate to smoothly guide the empty carrier 421 out. Whereas while the linking part 31 moves downward as arrowed in FIG. 5 away from the sensor 45, the sensor 45 would urge the motor 440 off. The above processes run repeatedly. Therefore, the configuration of the sensor 45 conduces to activate the transmission assembly 44 without the intimate motivation of the linking part 31, whereby the vibrations and abrasions generated during the cooperation of the feeder 4 and the auto mounting device 3 can be avoided to attain a quick and stable grabbing and collecting tasks of the auto mounting device 3 and reinforce the working efficiency.

To sum up, the feeder for an auto mounting device of the present invention takes advantage of the increment of the sensor which not only averts the auto device from directly touching the feeder but also executes the signal delivery to activate a transmission assembly during the reciprocation of the device. Therefore, the present invention prevents the feeder from vibrations and abrasions to render a preferable cooperation with the auto mounting device and to attain an efficient manipulation by the assistance of the transmission assembly.

While we have shown and described the embodiment in accordance with the present invention, it should be clear to those skilled in the art that further embodiments may be made without departing from the scope of the present invention.

I claim:

1. A feeder for an auto mounting device; said auto mounting device comprising a workbench, a linking part and a holder disposed on said workbench, and a feeder correlatively installed in response to said linking part; said feeder further including:

a main frame, which is installed on said workbench relative to said linking part, having an input entrance and an output exit connecting with said input entrance;

a blocking mean, which is installed on said input entrance, having an indentation and an opening arranged thereon; wherein a peeling surface being defined on a periphery of said indentation;

an intake assembly being installed on said main frame;

a transmission assembly having a motor mounted in said main frame, an engaging wheel driven by said motor, and a driving wheel driven by said motor for triggering a convolution of said intake assembly;

an input assembly having an input wheel pivoted to said main frame and a chip carrier wound around said input wheel; wherein, said chip carrier becoming fed by a rotation of said engaging wheel and triggering said input wheel; said chip carrier further having a tape, a plurality of notches arranged on said tape for receiving electronic chips, and a membrane stuck on said tape for covering said notches; said tape sequentially traveling along said input entrance, through said blocking mean, and out of said output exit; said membrane being obstructed by said peeling surface and peeled off said tape to expose said notches and said electronic chips to said opening in sequence, so as to allow said holder to grab said electronic chips and permit said membrane to be furled by said intake assembly; and a sensor being installed on said main frame for communicating with said motor and placed relative to said linking part at an interval; wherein, said sensor transmitting a signal to urge said motor while sensing a motivation from said linking part, so as to feed said chip carrier without vibrating said main frame.

2. The feeder for the auto mounting device as claimed in claim 1, wherein, a plurality of guiding wheels are pivoted on said main frame to provide guidance to said membrane and said chip carrier.

3. The feeder for the auto mounting device as claimed in claim 1, wherein, said intake assembly has a succeeding wheel geared to said driving wheel for transporting said membrane and a restricting wheel tightly leaning against said succeeding wheel.

4. The feeder for the auto mounting device as claimed in claim 3, wherein, said intake assembly further has a cover installed on a periphery of said restricting wheel to restrict an output route of said membrane.

* * * * *